United States Patent
Receveur et al.

(10) Patent No.: US 7,816,745 B2
(45) Date of Patent: Oct. 19, 2010

(54) WAFER LEVEL HERMETICALLY SEALED MEMS DEVICE

(75) Inventors: Rogier Receveur, Maastricht (NL); Cornel Marxer, Neucahtel (CH)

(73) Assignee: Medtronic, Inc., Minneapolis, MN (US)

( * ) Notice: Subject to any disclaimer, the term of this patent is extended or adjusted under 35 U.S.C. 154(b) by 0 days.

(21) Appl. No.: 11/066,820

(22) Filed: Feb. 25, 2005

(65) Prior Publication Data
US 2006/0192272 A1 Aug. 31, 2006

(51) Int. Cl.
*H01L 23/10* (2006.01)
(52) U.S. Cl. ............... 257/415; 257/689; 257/E23.193; 438/51; 438/456
(58) Field of Classification Search ................. 257/415, 257/689, E23.193; 438/51, 451
See application file for complete search history.

(56) References Cited

U.S. PATENT DOCUMENTS

| | | | |
|---|---|---|---|
| 4,291,293 A | | 9/1981 | Yamada et al. |
| 5,638,946 A | * | 6/1997 | Zavracky ..................... 200/181 |
| 5,866,469 A | * | 2/1999 | Hays ........................... 438/456 |
| 5,993,414 A | | 11/1999 | Haller |
| 6,194,678 B1 | | 2/2001 | Yoshikawa et al. |
| 6,391,742 B2 | * | 5/2002 | Kawai ......................... 438/456 |
| 6,465,854 B1 | * | 10/2002 | Muenzel et al. ............. 257/417 |
| 6,486,425 B2 | * | 11/2002 | Seki ............................ 200/181 |
| 6,489,670 B1 | | 12/2002 | Peterson et al. |
| 6,559,530 B2 | * | 5/2003 | Hinzel et al. ................ 257/684 |
| 6,603,238 B2 | | 8/2003 | Sakata et al. |
| 6,621,135 B1 | * | 9/2003 | Sridhar et al. ............... 257/415 |
| 6,633,079 B2 | * | 10/2003 | Cheever et al. ............. 257/723 |
| 6,660,564 B2 | | 12/2003 | Brady |
| 6,762,072 B2 | | 7/2004 | Lutz |
| 6,804,552 B2 | | 10/2004 | Thompson et al. |
| 6,828,640 B2 | * | 12/2004 | Delapierre ................... 257/420 |
| 6,841,861 B2 | | 1/2005 | Brady |
| 6,872,319 B2 | * | 3/2005 | Tsai ................................. 216/2 |
| 6,930,367 B2 | * | 8/2005 | Lutz et al. ................... 257/417 |
| 7,098,117 B2 | * | 8/2006 | Najafi et al. ................. 438/456 |
| 7,153,718 B2 | * | 12/2006 | Fischer et al. ................. 438/55 |
| 2002/0164111 A1 | * | 11/2002 | Mirza ........................... 385/18 |
| 2002/0164833 A1 | * | 11/2002 | Cho et al. ..................... 438/50 |

(Continued)

FOREIGN PATENT DOCUMENTS

EP 1167979 1/2002

OTHER PUBLICATIONS

Jakobsen et al., "Anodic Bonding for MEMS", Symposium on Semiconductor Wafer Bonding, Sep. 5-7, 2001, pp. 1-23, San Francisco, USA.

(Continued)

*Primary Examiner*—Steven J Fulk
(74) *Attorney, Agent, or Firm*—Carol F. Barry

(57) ABSTRACT

A hermetically sealed microelectromechanical system (MEMS) package includes a MEMS switch having a movable portion and a stationary portion with an electrical contact thereon. A glass lid is anodically bonded to the MEMS switch to form a sealed cavity over the movable portion of the MEMS switch. The glass lid includes a contact aperture to allow access to the electrical contact on the stationary portion of the MEMS switch. A family of body-implantable hermetically-sealed MEMS packages are provided according to certain aspects and embodiments of the present invention.

11 Claims, 6 Drawing Sheets

U.S. PATENT DOCUMENTS

| | | | |
|---|---|---|---|
| 2002/0190267 A1* | 12/2002 | Robertson | 257/130 |
| 2003/0073292 A1 | 4/2003 | Bartlett et al. | |
| 2003/0143775 A1* | 7/2003 | Brady | 438/106 |
| 2003/0160021 A1* | 8/2003 | Platt et al. | 216/2 |
| 2003/0183920 A1 | 10/2003 | Goodrich et al. | |
| 2003/0233133 A1 | 12/2003 | Greenberg et al. | |
| 2004/0077117 A1* | 4/2004 | Ding et al. | 438/51 |
| 2004/0155290 A1 | 8/2004 | Mech et al. | |
| 2004/0180464 A1* | 9/2004 | Horning et al. | 438/51 |
| 2004/0188821 A1* | 9/2004 | Chen et al. | 257/688 |
| 2004/0216988 A1* | 11/2004 | Receveur et al. | 200/181 |
| 2004/0259325 A1* | 12/2004 | Gan | 438/456 |
| 2005/0139967 A1* | 6/2005 | Eskridge et al. | 257/659 |

OTHER PUBLICATIONS

Li et al., "High Density Electrical Feedthrough Fabricated by Deep Reactive Ion Etching of Pyrex Glass", 2001, Japan.

* cited by examiner

WAFER LEVEL HERMETICALLY SEALED MEMS DEVICE

BACKGROUND OF THE INVENTION

The present invention relates to hermetic sealing of an implantable medical device, and particularly to a wafer level hermetic seal for an implantable medical device that employs a microelectromechanical system (MEMS).

Implantable medical devices (IMDs) employ internal electronic circuitry that is hermetically sealed in a biostable package. This internal electronic circuitry is typically implemented as one or more integrated circuits (ICs). More recently, the prospect of implementing switching circuitry as a MEMS system has been considered, as discussed in U.S. application Ser. No. 10/973,117 filed Oct. 26, 2004 for "MEMS Switching Circuit and Method for an Implantable Medical Device" by R. Receveur et al., which is hereby incorporated by reference. However, a MEMS is more difficult to employ in an implantable medical device than a system that employs only ICs, at least in part because of the more stringent packaging requirements to provide a particular environment around the MEMS. In addition, a MEMS package may need to redistribute electrical signals, provide mechanical support, handle power and provide thermal management functions. These considerations present challenges in designing an effective and efficiently manufacturable sealed MEMS package for an IMD.

Accordingly, there is a need in the art for an improved packaging solution for MEMS devices employed in implantable medical devices.

BRIEF SUMMARY OF THE INVENTION

The present invention provides a hermetically sealed MEMS package and a method of forming that package. The MEMS package includes a MEMS switch having a movable portion and a stationary portion with an electrical contact thereon. A glass lid is anodically bonded to the MEMS switch to form a sealed cavity over the movable portion of the MEMS switch. The glass lid includes a contact aperture to allow access to the electrical contact on the stationary portion of the MEMS switch.

DETAILED DESCRIPTION

Figure 1:
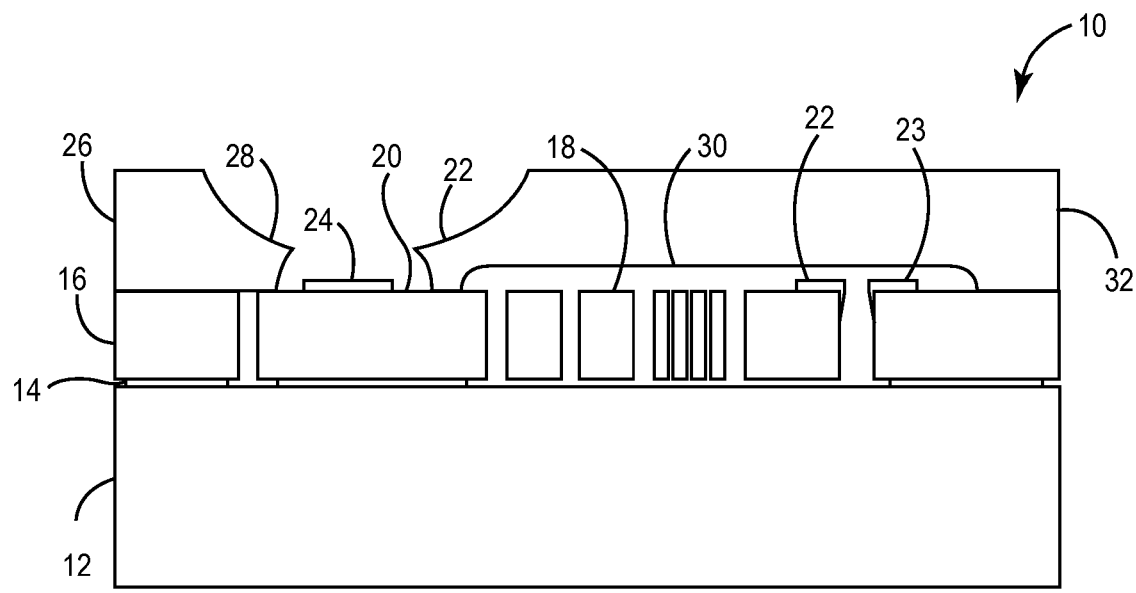
FIG. 1 is a cross-sectional view of a MEMS package according to an embodiment of the present invention.

FIG. 1 is a cross-sectional view of MEMS packaging 10 according to an exemplary embodiment of the present invention. MEMS packaging 10 includes silicon-on-insulator (SOI) carrier layer 12, silicon dioxide features 14, SOI device layer 16 patterned as a MEMS switch (also referred to herein as MEMS switch 16) and having movable parts 18 and stationary part 20, MEMS switch metallization layers 22 and 23, contact metallization 24, and glass lid 26 having contact aperture 28 for allowing electrical connection to contact metallization 24. Glass lid 26 forms sealed interior cavity 30 around movable parts 18 of MEMS switch 16.

MEMS switch 16 is illustrated schematically in FIG. 1 to include movable parts 18 and stationary part 20. Generally speaking, MEMS switch 16 is closed and opened by switch metallization layers 22 and 23 being forced into and out of contact with one another by electro-mechanical operation of movable parts 18 of MEMS switch 16. Contact metallization 24 is provided on a top surface of stationary part 20 to receive electrical control signals for operating MEMS switch 16, and also to receive the electrical signals that are to be transmitted or blocked by MEMS switch 16, such as a pulse generated by an implantable pulse generator in one particular embodiment. For example, MEMS switch 16 may be implemented as an electrostatic comb actuator, having a movable actuator member and fixed actuator members that are attracted to one another by application of an actuation voltage to contact metallization 24, resulting in movement of movable parts 18 to selectively open and close MEMS switch 16. A more thorough description of the configuration and operation of a MEMS switch that would be suitable for implementation as MEMS switch 16 is found in U.S. application Ser. No. 10/973,117 filed Oct. 26, 2004 for "MEMS Switching Circuit and Method for an Implantable Medical Device" by R. Receveur et al., which has been incorporated herein by reference.

MEMS switch 16 is housed in cavity 30 that includes a controlled, preserved interior atmosphere where movable parts 18 are free to move. This atmosphere is provided by glass lid 26, which forms hermetically sealed cavity 30 around MEMS switch 16. Glass lid 26 has standoff portions 32 around movable parts 18 of MEMS switch 16 and a recessed area above movable parts 18 of MEMS switch 16, so that free movement within the resulting cavity 30 inside of glass lid 26 is possible. In addition, glass lid 26 is formed with contact aperture 28, which allows electrical contact-to-contact metallization 24 on stationary part 20 of MEMS switch 16.

In one embodiment, glass lid 26 is secured to the silicon structure of MEMS switch 16 by anodic (i.e., electrostatic) bonding. A covalent bond is formed between the surface atoms of glass lid 26 and the silicon of MEMS switch 16 when both structures are pressed together under application of a voltage at an elevated temperature, creating a hermetic seal between the structures. In a typical embodiment, glass lid 26 is composed of a material that has a thermal coefficient of expansion (TCE) similar to that of silicon, such as Pyrex or a similar material. The silicon material of MEMS switch 16 may be composed of a fine grain polysilicon layer, a silicon-on-insulator (SOI) layer, or another semiconductive material known in the art.

An example of an anodic bonding process for securing glass lid 26 to the silicon material of MEMS switch 16 is performed at a temperature in the range of 300-450° C. at a voltage in the range of 200-2000 Volts. The bond width is typically at least 250 micro-meters (µm), and the processing time is typically about 10-20 minutes. A bond strength of greater than 20 mega-Pascals (Mpa) can be achieved by anodically bonding glass lid 26 to the silicon material of MEMS switch 16, which provides an excellent hermetic seal suitable for use in an implantable medical device.

Figure 2:
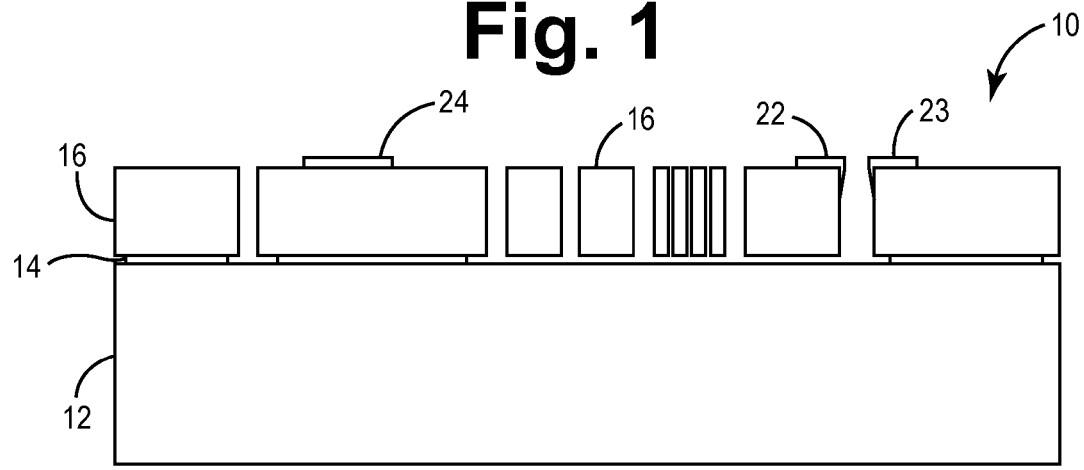
FIG. 2 is a cross-sectional view of an intermediate fabrication condition of the MEMS package of FIG. 1, shown after a temporary shadow mask has been removed for selective deposition of contact metallization and switch metallization layers.

An example of a process of fabricating MEMS packaging 10 will now be described. MEMS switch 16 is fabricated on SOI layer 12, supported by silicon dioxide features 14, in a manner generally known in the art. After MEMS switch 16 has been formed, a shadow mask technique is used to selectively deposit contact metallization layer 24 and switch metallization layers 22 and 23 while keeping the areas where glass lid 26 is to contact MEMS switch 16 clean, for subsequent anodic bonding. To form the shadow mask, a silicon wafer is etched (such as by potassium hydroxide (KOH) etching) with through holes for formation of metallization regions. The silicon wafer is temporarily attached to portions of the SOI layer forming MEMS switch 16, such as by wax, and is aligned so that the through holes are located in the areas where contact metallization layer 24 and switch metallization layers 22 and 23 are to be formed. Next, a metal deposition step is performed, with a metallization material such as Titanium-Ruthenium (where Titanium is the adhesion layer for the Ruthenium) being deposited through the through holes of the silicon wafer to form contact metallization layer 24 and switch metallization layers 22 and 23. Finally, the silicon wafer that forms the shadow mask is detached from MEMS switch 16, such as by heating the wax that attaches the two structures, leaving contact metallization layer 24 and switch metallization layers 22 and 23 formed on MEMS switch 16. This stage of the process is illustrated in FIG. 2. which is a cross-sectional view of MEMS packaging 10 after the metallization layers have been deposited and the temporary shadow mask has been removed.

Next, glass lid 26 is pre-etched and aligned in the proper position with respect to MEMS switch 16, for anodic bonding. In an example of the process, glass lid 26 is pressed toward MEMS switch 16 with 250 kilo-grams (kg) of pressure, at a temperature of 365° C. and with application of a voltage of 230 V. In consideration of these parameters, MEMS switch 16 is designed to have an actuation voltage (that is, the voltage applied in order to close the switch) that is not significantly lower than the anodic bonding voltage (which is 230 V in this example). For example, the actuation voltage may be within 100 V of the anodic bonding voltage. One way to achieve this relatively high actuation voltage is to design the number of comb fingers and the size of the springs of MEMS switch 16 in such a manner that MEMS switch 16 has a stiffness that requires a relatively high voltage (such as about 150 V, for example) to actuate. This design is different than many typical existing MEMS switch designs, which are actuated by a voltage in the range of 10-20 V. In addition, MEMS switch 16 (and specifically contact metallization layer 24 and switch metallization layer 22 and 23) is designed so that the anodic bonding temperature (in this example, 365° C.) does not have a negative effect on the metallization. For example, Titanium-Ruthenium metallization layers may be used, as this material remains a good electrical contact material with low electrical resistance at high temperatures such as a 365° C. anodic bonding temperature.

In a typical process, a plurality of MEMS switches 16 and glass lids 26 are formed simultaneously on a wafer. Thus, once each glass lid 26 is bonded to each MEMS switch 16, the wafer is diced into individual hermetically sealed switches. As a result, it is relatively simple to manufacture high quantities of hermetically sealed MEMS packaging 10.

Figure 3:
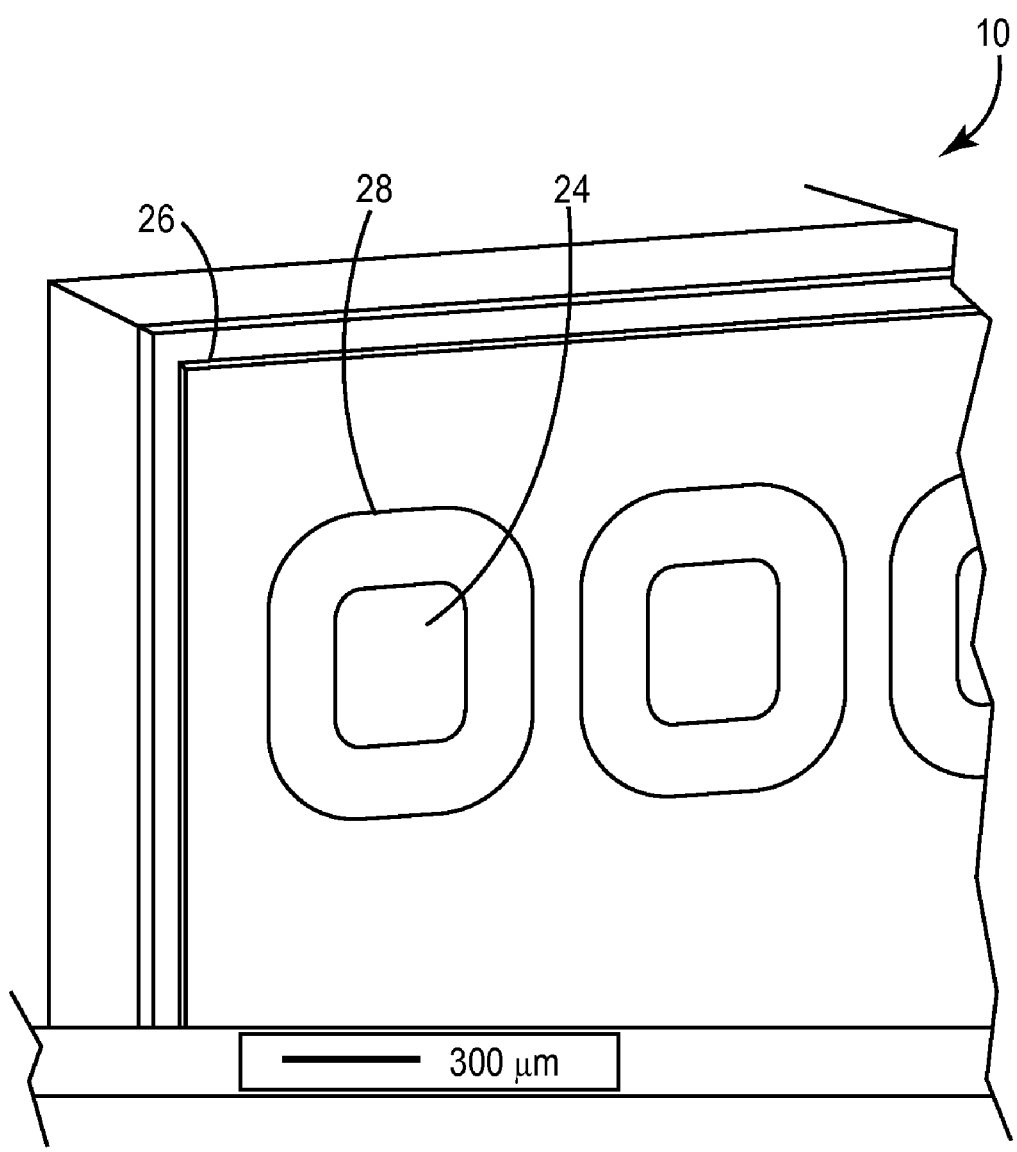
FIG. 3 is a perspective view of a hermetically sealed MEMS package according to an embodiment of the present invention.

FIG. 3 is a perspective view of hermetically sealed MEMS packaging 10 according to an embodiment of the present invention. FIG. 3 shows the configuration of contact apertures 28 in glass lid 26 that allow electrical connection to be made to contact metallization 24 of the MEMS switch sealed inside the package. The ability of this design to contact the MEMS switch through the top of glass lid 26 has a number of advantages. First, this contact scheme has minimal effect on the mechanical stability and hermeticity of the packaging structure, ensuring that the MEMS switch is able to freely move when actuated. Second, this design allows multiple glass lids 26 on a wafer to be diced simultaneously, after bonding to a respective MEMS switch. MEMS packaging 10 is therefore efficient to reliably manufacture.

Hermetically sealed MEMS packaging 10, fabricated in the manner described in the examples above, was tested to confirm that the bond strength and hermeticity was acceptable for use in an implantable medical device. Using MIL-STD-883 standard test methods, a shear strength of 114 Newtons±26 Newtons and a Helium leak rate of better than $2 \times 10^{-8}$ cubic centimeters per second were measured in 31 of 37 samples tested. 16 of the 31 samples were then subjected to thermal stress tests (thermal cycling), and 14 samples survived. The other 15 samples were subjected to mechanical stress tests (shock and vibration), and 13 samples survived. Thus, MEMS packaging samples were obtained that provide excellent bond strength, hermeticity, thermal stress resistance and mechanical stress resistance, at a rate of greater than 70% yield. These results confirm that MEMS packaging 10 is acceptable for use in implantable medical devices. It is expected that further refinement of the quality of the process and material conditions employed could result in further improvement of the yield rate as well.

Figure 4A:
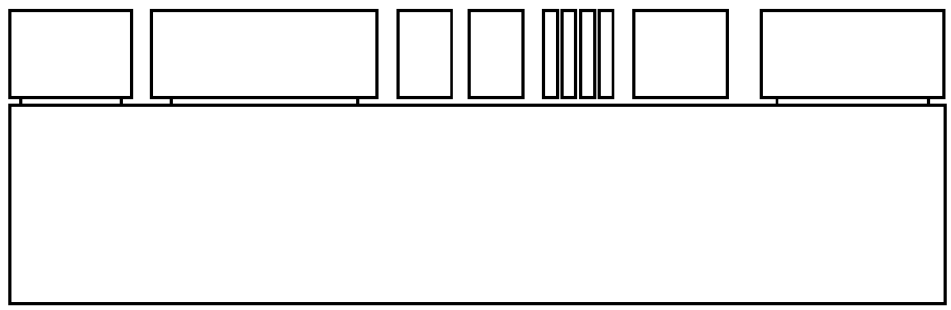
FIG. 4A-C depict elevational side views in cross-section of the packages depicted in FIG. 1 and FIG. 2 and including 15 annotated processing steps to be performed according to the present invention.
Figure 4B:
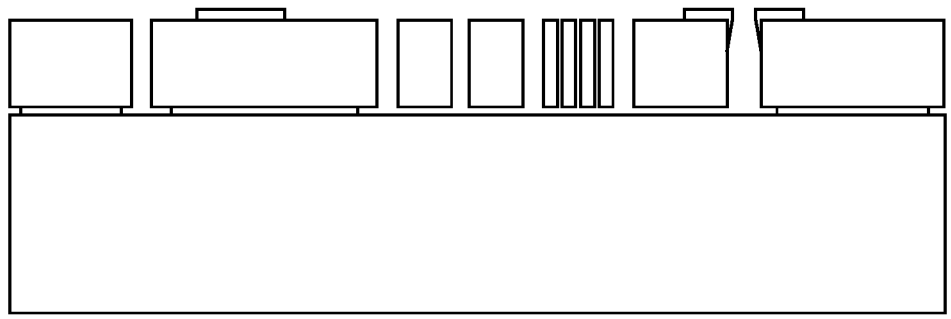
Figure 4C:
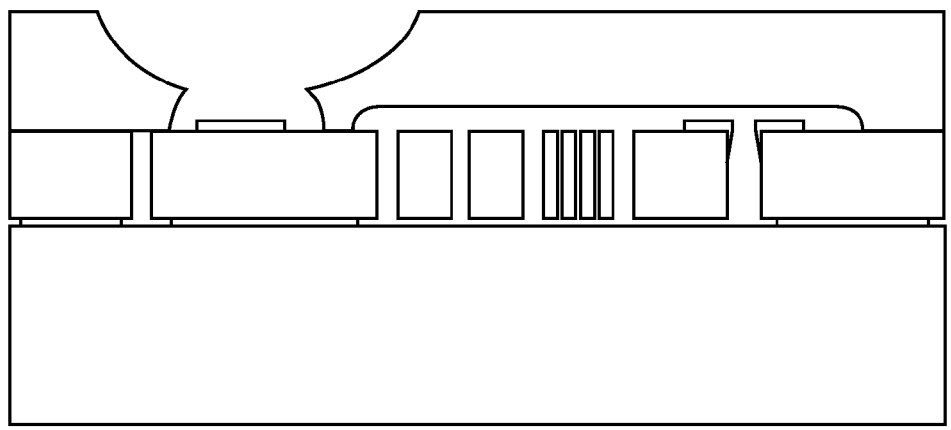
Figure 5A:
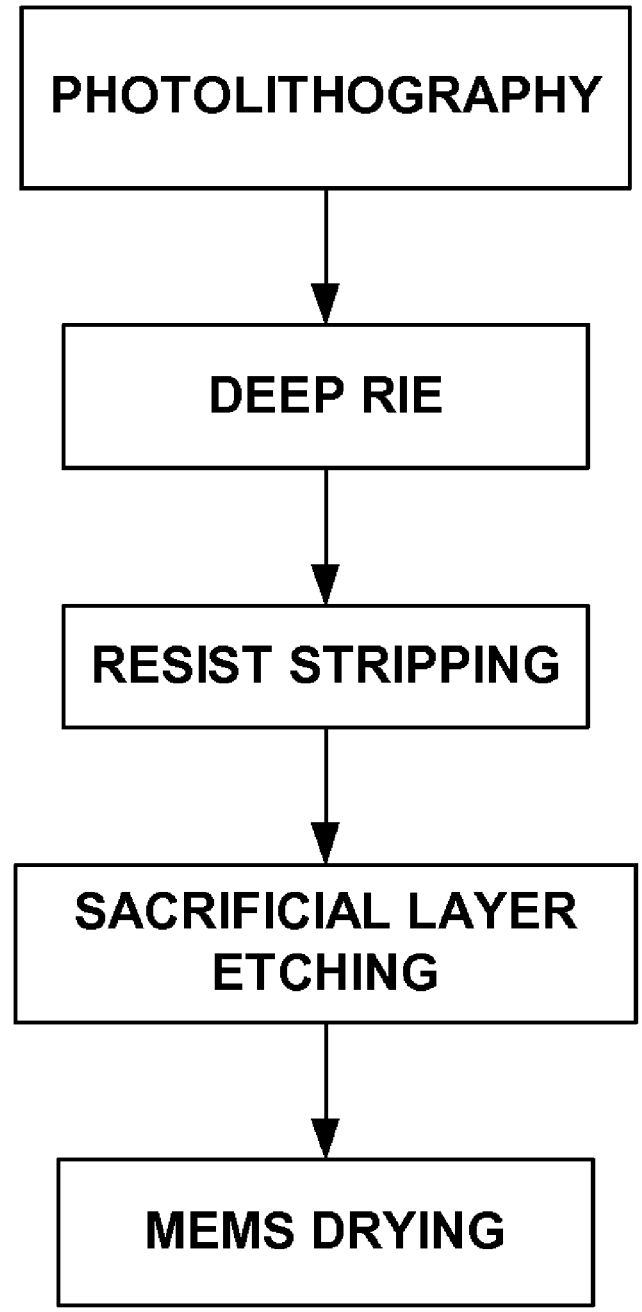
FIGS. 5A-C include processing steps corresponding to the processing of the package shown in FIGS. 4A-C.
Figure 5B:
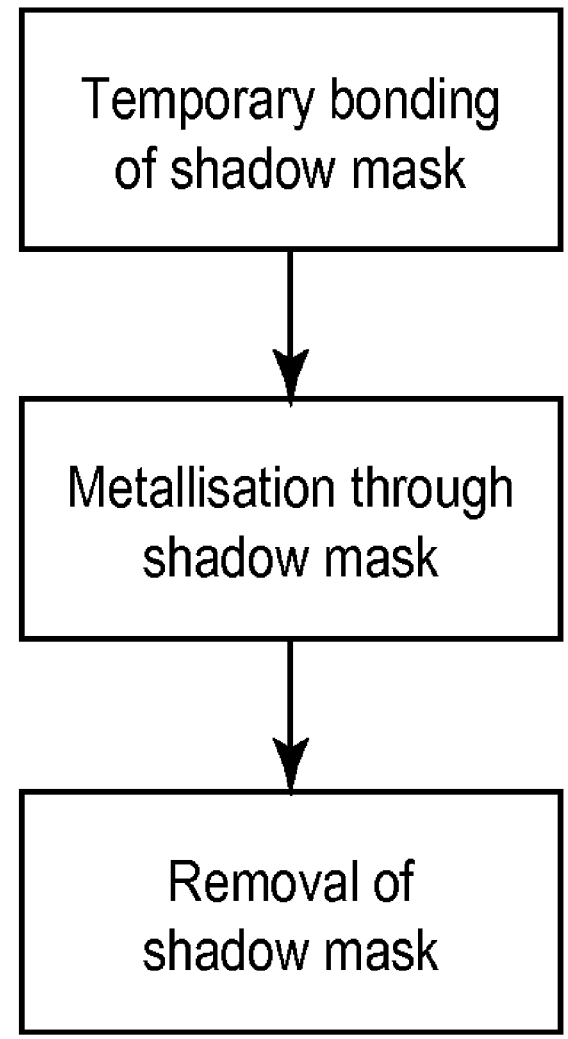
Figure 5C:
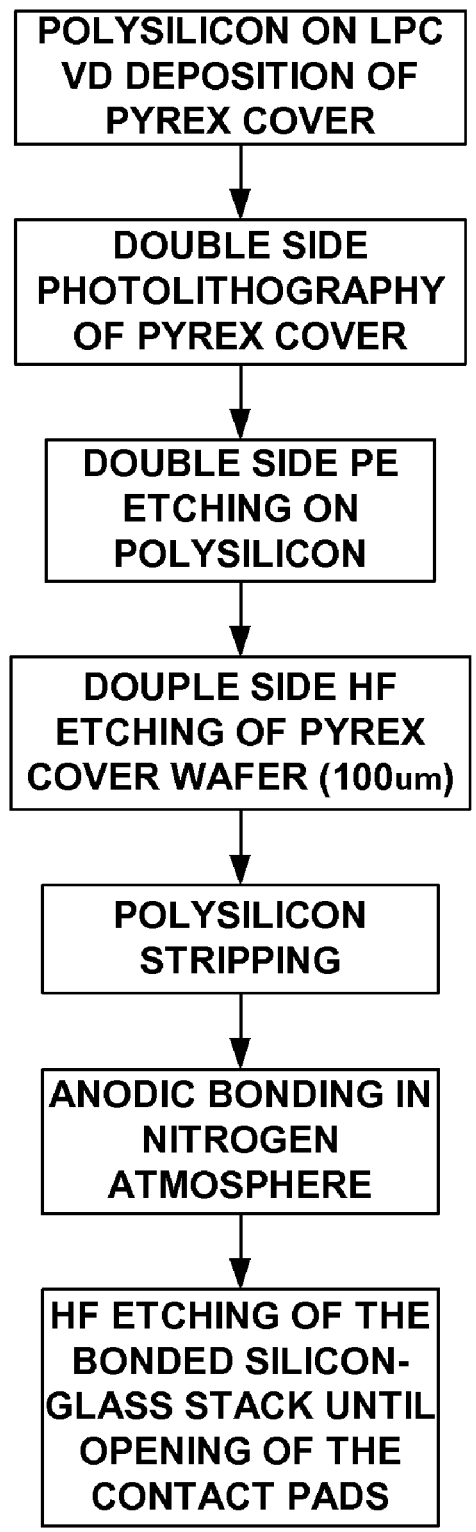

FIGS. 4A-C depict elevational side views in cross-section of the packages depicted in FIG. 1 and FIG. 2 and FIGS. 5A-C are flow charts including 15 annotated processing steps to be performed according to the present invention. The three views in FIGS. 4A-C depict processing of the package according to the invention at discrete moments during fabrication. Processing steps shown in FIG. 5A correspond to the processing of the package as depicted in FIG. 4A. Processing steps shown in FIG. 5B correspond to the processing of the package as depicted in FIG. 4B, and processing steps shown in FIG. 5C correspond to the processing of the package as depicted in FIG. 4C. Also, while only representative shadow mask is depicted herein those of skill in the art readily recognize that many different specific shadow masks can be used according to the instant invention based on a desired end product.

The present invention provides a hermetically sealed MEMS package suitable for use in an implantable medical device, for example. A glass lid is anodically bonded to a MEMS switch, forming a sealed interior cavity for free movement of the MEMS switch. A contact aperture is provided in the glass lid to allow electrical contact to a metallization layer that is formed on a stationary portion of the MEMS switch. This design provides excellent mechanical stability and hermeticity, and is efficient to manufacture, with all aspects fabricated at the wafer level.

Although the present invention has been described with reference to preferred embodiments, workers skilled in the art will recognize that changes may be made in form and detail without departing from the spirit and scope of the invention.

The invention claimed is:

1. A miniature electromechanical system (MEMS) package comprising:
    a silicon substrate layer;
    a MEMS switch formed solely in the silicon substrate layer having a movable portion with a movable switch metallization layer and a stationary portion with an electrical contact thereon and with a stationary switch metallization layer for electrically contacting the movable switch metallization layer upon movement of the movable portion to a closed position; and a glass lid anodically bonded to the stationary portion of the MEMS switch to form a sealed cavity over the movable portion of the MEMS switch, the glass lid including a contact aperture aligned directly over the electrical contact to allow access to the electrical contact on the stationary portion of the MEMS switch.

2. A MEMS package according to claim 1, wherein the glass lid comprises a material having a thermal coefficient of expansion (TCE) similar to a TCE of the MEMS switch.

3. A MEMS package according to claim 2, wherein the glass lid includes a borosilicate material.

4. A MEMS package according to claim 1, wherein the electrical contact includes a material that is able to withstand an anodic bonding temperature of approximately 365° C.

5. A MEMS package according to claim 4, wherein the electrical contact includes at least one of: a titanium material, a ruthenium material, a combination of titanium and ruthenium.

6. A MEMS package according to claim 5, wherein the MEMS switch actuates when subjected to an electrical voltage of about 150 Volts.

7. A MEMS package according to claim 5, wherein the magnitude of the anodic bonding voltage is about 230 Volts.

8. A MEMS package according to claim 1, wherein the MEMS switch is actuated when subjected to an electrical voltage having a magnitude of approximately 100 volts from an anodic bonding voltage.

9. The MEMS package of claim 1 further comprising a covalent bond formed between surface atoms of the glass lid and surface atoms of the silicon substrate layer.

10. A miniature electromechanical system (MEMS) package comprising:

a silicon substrate layer;

a MEMS switch formed solely in the silicon substrate layer having a movable portion with a movable switch metallization layer and a stationary portion with an electrical contact thereon and with a stationary switch metallization layer for electrically contacting the movable switch metallization layer upon movement of the movable portion to a closed position; and a glass lid formed as a single part having a recess and an aperture and being anodically bonded to the stationary portion of the MEMS switch;

wherein the aperture being aligned directly over the electrical contact to allow access to the electrical contact and the recess being aligned over the movable portion of the MEMS switch;

wherein the glass lid and the stationary portion form a hermetic seal there between, the hermetic seal surrounding the electrical contact and surrounding the movable portion to form a sealed cavity over the movable portion.

11. The MEMS package of claim 10 wherein the hermetic seal comprises a covalent bond formed between surface atoms of the glass lid and surface atoms of the silicon substrate.

* * * * *